United States Patent
Fan

(10) Patent No.: US 9,964,825 B2
(45) Date of Patent: May 8, 2018

(54) GRAPHENE BACKLIGHT MODULE AND LIQUID CRYSTAL DISPLAY DEVICE INCLUDING THE SAME

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 228 days.

(21) Appl. No.: 15/031,744

(22) PCT Filed: Apr. 8, 2016

(86) PCT No.: PCT/CN2016/078794
§ 371 (c)(1),
(2) Date: Apr. 24, 2016

(87) PCT Pub. No.: WO2017/166332
PCT Pub. Date: Oct. 5, 2017

(65) Prior Publication Data
US 2018/0088379 A1   Mar. 29, 2018

(30) Foreign Application Priority Data
Mar. 28, 2016 (CN) .......................... 2016 1 0184246

(51) Int. Cl.
*G09F 13/04* (2006.01)
*G02F 1/1368* (2006.01)
(Continued)

(52) U.S. Cl.
CPC ...... *G02F 1/1368* (2013.01); *G02F 1/133605* (2013.01); *G02F 1/133621* (2013.01);
(Continued)

(58) Field of Classification Search
CPC ............. G02F 1/1335; G02F 1/133514; G02F 1/133608; H01L 33/08; G02B 6/0068
See application file for complete search history.

(56) References Cited

U.S. PATENT DOCUMENTS 9,354,465 B2 * 5/2016 Guo .................. G02F 1/133514
9,817,264 B2 * 11/2017 Li ..................... G02F 1/133516
(Continued)

FOREIGN PATENT DOCUMENTS

CN          104297972 A       1/2015

*Primary Examiner* — Ali Alavi
(74) *Attorney, Agent, or Firm* — Andrew C. Cheng

(57) ABSTRACT

The present disclosure teaches a graphene backlight module and a liquid crystal display (LCD) device including the backlight module. The backlight module includes a lower substrate, a number of graphene sources, a number of graphene drains, a graphene light generation layer, a first insulating protection layer, a number of graphene gates, and a second insulating protection layer. Graphene is used to make the gates, sources, drains, and the light generation layer of the backlight module. The graphene backlight module therefore functions both as a lighting unit and a driving unit to the liquid crystal, thereby simplifying the LCD device's structure and manufacturing process. In addition, as there is no need for the light guide plate and optical films required by conventional backlight modules, the thinning of the LCD device is achievable.

20 Claims, 1 Drawing Sheet

(51) Int. Cl.
G02F 1/1335 (2006.01)
G02F 1/1362 (2006.01)
H01L 33/00 (2010.01)
H01L 33/26 (2010.01)
H01L 33/60 (2010.01)
H01L 27/15 (2006.01)
G02F 1/1339 (2006.01)

(52) U.S. Cl.
CPC ...... *G02F 1/136209* (2013.01); *H01L 27/156* (2013.01); *H01L 33/0041* (2013.01); *H01L 33/26* (2013.01); *H01L 33/60* (2013.01); *G02F 1/13394* (2013.01); *G02F 1/133528* (2013.01)

(56) References Cited

U.S. PATENT DOCUMENTS

| | | | |
|---|---|---|---|
| 9,851,601 B2 * | 12/2017 | Guo | G02F 1/133516 |
| 2013/0093985 A1 * | 4/2013 | Kang | G02F 1/133377 349/106 |
| 2016/0187721 A1 | 6/2016 | Guo et al. | |

* cited by examiner

GRAPHENE BACKLIGHT MODULE AND LIQUID CRYSTAL DISPLAY DEVICE INCLUDING THE SAME

BACKGROUND OF THE INVENTION

1. Field of the Invention

The present disclosure generally relates to liquid crystal displays, and particularly relates to a graphene backlight module and a liquid crystal display device including the graphene backlight module.

2. The Related Arts

Liquid crystal displays (LCDs) have advantages such as small form factor, energy-efficient, and no radiation, etc. LCDs are therefore widely applied in TVs, mobile phones, and Personal Digital Assistants (PDAs), digital cameras, desktop computer screens, or notebook computer screens, etc.

Most existing LCDs include a casing, a liquid crystal panels inside the casing, and a backlight module also inside the casing. The liquid crystal panel itself does not illuminate and requires the backlight module as light source so as to display images. Existing backlight modules include a backlight source, a light guide plate, diffusion film and other optical films. In addition, existing LCDs require thin-film-transistor (TFT) driving units to drive liquid crystal pixels in displaying images, making the structure of LCDs even more complicated.

SUMMARY OF THE INVENTION

The technical issue addressed by the present disclosure is to provide a graphene backlight module and a liquid crystal display (LCD) device including the graphene backlight module so as to simply the structure of LCD devices and to achieve the thinning of the LCD devices.

To resolve the above technical issue, the present disclosure teaches a graphene backlight module, including a lower substrate, a number of graphene sources, a number of graphene drains, a graphene light generation layer, a first insulating protection layer, a number of graphene gates, a second insulating protection layer, a metallic reflection layer, and a first black matrix. The graphene sources and drains are disposed alternately at intervals on the lower substrate. The graphene light generation layer is disposed on the lower substrate, the graphene sources and drains, where the graphene light generation layer includes a number of graphene light generation blocks disposed at intervals, and each graphene light generation block covers a pair of graphene source and drain. The first insulating protection layer covers the lower substrate and the graphene light generation layer. The graphene gates are disposed at intervals on the first insulating protection layer, each corresponding to a graphene light generation block. The second insulating protection layer covers the graphene gates and the first insulating protection layer. The metallic reflection layer is disposed along a side of the lower substrate away from the graphene light generation layer. The first black matrix is disposed on the second insulating protection layer and among the graphene light generation blocks.

The graphene gates are made of a graphene oxide; the graphene sources and drains are made of a reduced graphene oxide; and the graphene light generation layer is made of a semi-reduced graphene oxide.

The lower substrate is made of Polyethylene terephthalate (PET), glass, or nickel.

The graphene light generation blocks produce red light if the voltage difference between the graphene gates and sources is 3.3~10V; the graphene light generation blocks produce green light of the voltage difference between the graphene gates and sources is 20~30V; and the graphene light generation blocks produce blue light if the voltage difference between the graphene gates and sources is 40~50V.

The present disclosure teaches another graphene backlight module, including a lower substrate, a number of graphene sources, a number of graphene drains, a graphene light generation layer, a first insulating protection layer, a number of graphene gates, and a second insulating protection layer. The graphene sources and drains are disposed alternately at intervals on the lower substrate. The graphene light generation layer is disposed on the lower substrate, the graphene sources and drains, where the graphene light generation layer includes a number of graphene light generation blocks disposed at intervals, and each graphene light generation block covers a pair of graphene source and drain. The first insulating protection layer covers the lower substrate and the graphene light generation layer. The graphene gates are disposed at intervals on the first insulating protection layer, each corresponding to a graphene light generation block. The second insulating protection layer covers the graphene gates and the first insulating protection layer.

The graphene backlight module further includes a metallic reflection layer disposed along a side of the lower substrate away from the graphene light generation layer.

The graphene backlight module further includes a first black matrix disposed on the second insulating protection layer and among the graphene light generation blocks.

The graphene gates are made of a graphene oxide; the graphene sources and drains are made of a reduced graphene oxide; and the graphene light generation layer is made of a semi-reduced graphene oxide.

The lower substrate is made of Polyethylene terephthalate (PET), glass, or nickel.

The graphene light generation blocks produce red light if the voltage difference between the graphene gates and sources is 3.3~10V; the graphene light generation blocks produce green light of the voltage difference between the graphene gates and sources is 20~30V; and the graphene light generation blocks produce blue light if the voltage difference between the graphene gates and sources is 40~50V.

The graphene light generation blocks include graphene light generation blocks producing red light, graphene light generation blocks producing green light, and graphene light generation blocks producing blue light, disposed alternately at intervals.

The present disclosure further teaches a LCD device including a graphene backlight module, q liquid crystal member, an upper substrate, a lower polarization film, and an upper polarization film. The liquid crystal member is disposed between the graphene backlight module and the upper substrate. The lower polarization film is disposed between a light emission side of the graphene backlight module and the liquid crystal member. The upper polarization film is disposed on a side of the upper substrate away from the liquid crystal member. The graphene backlight module includes a lower substrate, a number of graphene sources, a number of graphene drains, a graphene light generation layer, a first insulating protection layer, a number of graphene gates, and a second insulating protection layer.

The graphene sources and drains are disposed alternately at intervals on the lower substrate. The graphene light generation layer is disposed on the lower substrate, the graphene sources and drains, where the graphene light generation layer includes a number of graphene light generation blocks disposed at intervals, and each graphene light generation block covers a pair of graphene source and drain. The first insulating protection layer covers the lower substrate and the graphene light generation layer. The graphene gates are disposed at intervals on the first insulating protection layer, each corresponding to a graphene light generation block. The second insulating protection layer covers the graphene gates and the first insulating protection layer.

The graphene backlight module further includes a metallic reflection layer disposed along a side of the lower substrate away from the graphene light generation layer.

The graphene backlight module further includes a first black matrix disposed on the second insulating protection layer and among the graphene light generation blocks.

The graphene gates are made of a graphene oxide; the graphene sources and drains are made of a reduced graphene oxide; and the graphene light generation layer is made of a semi-reduced graphene oxide.

The lower substrate is made of Polyethylene terephthalate (PET), glass, or nickel.

The graphene light generation blocks produce red light if the voltage difference between the graphene gates and sources is 3.3~10V; the graphene light generation blocks produce green light of the voltage difference between the graphene gates and sources is 20~30V; and the graphene light generation blocks produce blue light if the voltage difference between the graphene gates and sources is 40~50V.

The graphene light generation blocks include graphene light generation blocks producing red light, graphene light generation blocks producing green light, and graphene light generation blocks producing blue light, disposed alternately at intervals.

The LCD device further includes a number of partition columns sandwiched between the lower polarization film and the upper substrate and separating the liquid crystal member into a number of regions, wherein each region corresponds to a graphene light generation block in the graphene backlight module.

The LCD device further includes a second black matrix disposed between the partition columns and the upper substrate.

The advantages of the present disclosure are as follows. Graphene is used to make the gates, sources, drains, and the light generation layer of the backlight module and the LCD device. The graphene backlight module therefore functions both as a lighting unit and a driving unit to the liquid crystal, thereby simplifying the LCD device's structure and manufacturing process. In addition, as there is no need for the light guide plate and optical films required by conventional backlight modules, the thinning of the LCD device is achievable.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

The present disclosure employs a number of terms in referring to specific components. Persons having ordinary skill in the art should understand that manufacturers may adopt different terms for identical components. The present disclosure does not rely on these terms in distinguishing the components, but use their functional difference as the basis of differentiation. A detailed description of the present disclosure is provided as follow, together with the accompanied drawings.

Figure 1:
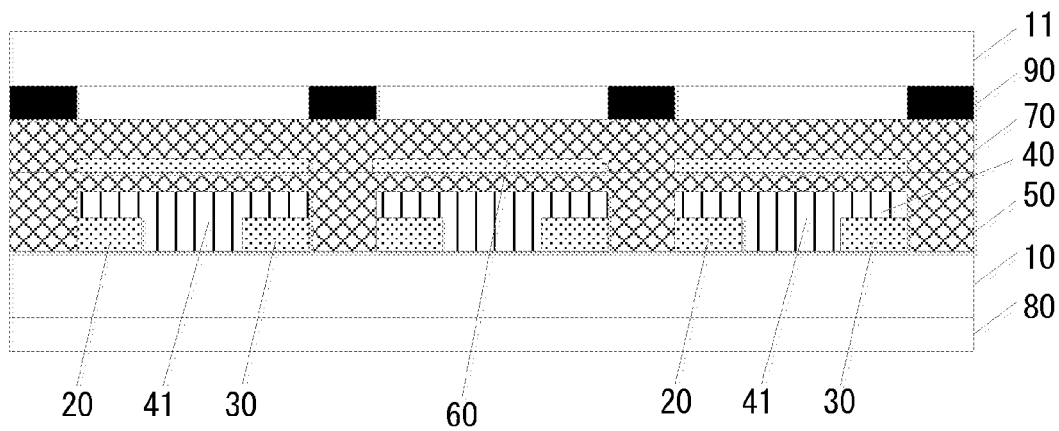
FIG. 1 is a schematic diagram showing a graphene backlight module according to an embodiment of the present disclosure.

FIG. 1 is a schematic diagram showing a graphene backlight module according to an embodiment of the present disclosure. As illustrated, the graphene backlight module 1 includes a lower substrate 10, a number of graphene sources 20, a number of graphene drains 30, a graphene light generation layer 40, a first insulating protection layer 50, a number of graphene gates 60, and a second insulating protection layer 70.

The lower substrate 10 is made of an air-tight and water-tight material such as Polyethylene terephthalate (PET), glass, or nickel. In the present embodiment, the lower substrate has a water and oxygen permeability lass then $10^{-4}$, thereby enhancing the impermeability of the graphene backlight module.

The graphene sources 20 and drains 30 are disposed alternately at intervals on the lower substrate 10. Preferably, the graphene sources 20 and drains 30 are made of a reduced graphene oxide.

The graphene light generation layer 40 includes a number of graphene light generation blocks 41 disposed at intervals on the lower substrate 10, the graphene sources 20 and drains 30. Each graphene light generation block 41 covers a pair of graphene source 20 and drain 30. Preferably, the graphene light generation layer 40 is made of a semi-reduced graphene oxide.

The first insulating protection layer 50 covers the lower substrate 10 and the graphene light generation layer 40. Preferably, the first insulating protection layer 50 is made of a silicon nitride (SiNx).

The graphene gates 60 are disposed at intervals on the first insulating protection layer 50, each corresponding to a graphene light generation block 41. Preferably, the graphene gates 60 are made of a graphene oxide.

The second insulating protection layer 70 covers the graphene gates 60 and the first insulating protection layer 50. Preferably, the second insulating protection layer 70 is made of a silicon nitride (SiNx). For persons having ordinary skill in the art, the first and second insulating protection layers 50 and 70 can be made of a same material or different materials. The present disclosure is not limited to one of the two alternatives.

Graphene is a two-dimensional material having characteristics between conductors and semi-conductors. Specifically, graphene has superior features such as hardness, high transparency (penetration≈97.7%), high thermal conductivity (reaching 5300 W/m·K), high electron mobility (exceeding 15000 cm2/V·s), etc. Therefore, graphene may be used to make gates, sources, and drains.

The principle of light generation of the graphene backlight module 1 is as follows. The electrical fields of the graphene gates 60 adjust the Fermi levels of the graphene light generation blocks 41, and therefore the light wavelengths of the graphene light generation blocks 41. The graphene light generation blocks 41 therefore may produce lights of different colors.

Specifically, if the graphene light generation blocks 41 are made of a semi-reduced graphene oxide, the graphene light generation blocks 41 produce red light if the voltage difference (Vgs) between the graphene gates 60 and sources 20 is 0~10V and the voltage difference (Vds) between the graphene sources 20 and drains 30 exceeds the threshold voltage (Vth). The graphene light generation blocks 41 produce green light if the voltage difference (Vgs) between the graphene gates 60 and sources 20 is 20~30V and the voltage difference (Vds) between the graphene sources 20 and drains 30 exceeds the threshold voltage (Vth). The graphene light generation blocks 41 produce blue light if the voltage difference (Vgs) between the graphene gates 60 and sources 20 is 40~50V and the voltage difference (Vds) between the graphene sources 20 and drains 30 exceeds the threshold voltage (Vth).

In addition, the intensity of the red, green, blue light produced by the graphene light generation blocks 41 can be altered by changing the voltage difference (Vds) between the graphene sources 20 and drains 30, thereby achieving different grey levels.

In the present embodiment, red-light graphene light generation blocks 41, green-light graphene light generation blocks 41, and blue-light graphene light generation blocks 41 are disposed alternately at intervals in the graphene backlight module 1.

Preferably, the graphene backlight module 1 further includes a metallic reflection layer 80 disposed along a side of the lower substrate 10 away from the graphene light generation layer 40. In other words, the metallic reflection layer 80 is disposed beneath the lower substrate 10. The metallic reflection layer 80 is made of a metal of high reflectivity such as aluminum (Al), silver (Ag), or an alloy thereof, so as to enhance the light generation efficiency of the graphene backlight module 1.

Preferably, the graphene backlight module 1 further includes a first black matrix 90 disposed on the second insulating protection layer 80 and among the graphene light generation blocks 41. In other words, the first black matrix 90 is positioned to a non-lighting side of the graphene backlight module 1 so as to prevent the leakage and mixing of the red, green, and blue lights from the graphene light generation blocks 41, thereby enhancing the purity of the lights.

Preferably, the graphene backlight module 1 further includes a protection substrate 11 disposed on the black matrix 90. The protection substrate 11 is made of an air-tight and water-tight material such as PET, glass, etc. When the graphene backlight module 1 is processed as an individual device, the protection substrate 11 is required so as to protect the graphene backlight module 1's internal structure. When the graphene backlight module 1 is applied to a display device, the protection substrate 11 is removed.

Figure 2:
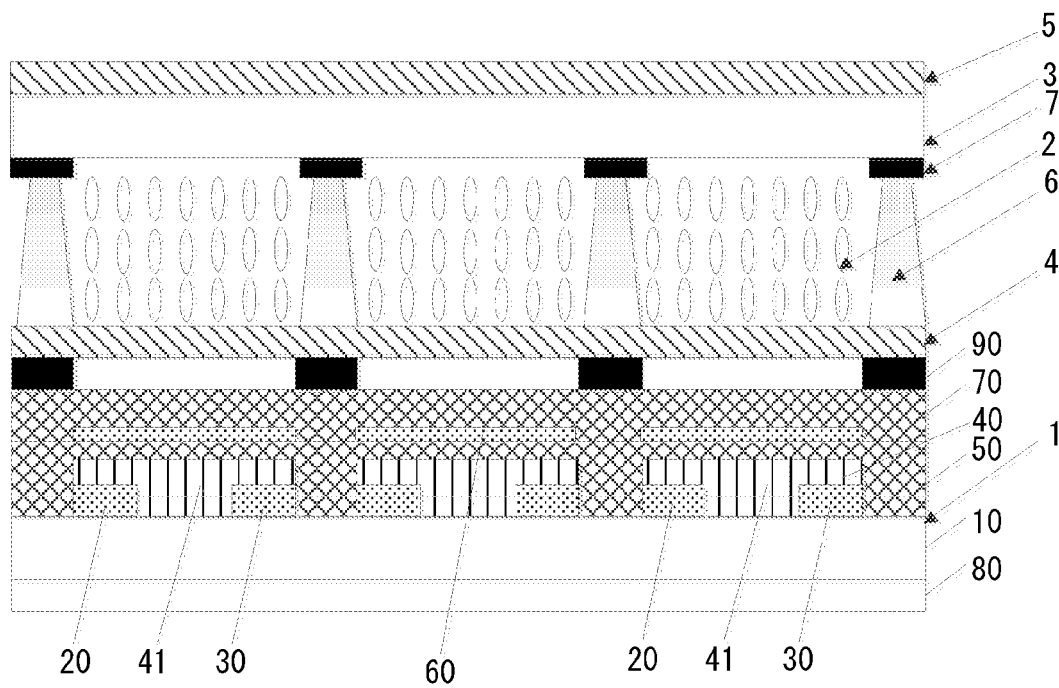
FIG. 2 is a schematic diagram showing a liquid crystal display device including the graphene backlight module of FIG. 1 according to an embodiment of the present invention.

FIG. 2 is a schematic diagram showing a liquid crystal display (LCD) device including the above-described graphene backlight module according to an embodiment of the present invention. As illustrated, the LCD device 100 includes a graphene backlight module 1 of FIG. 1, a liquid crystal member 2, an upper substrate 3, a lower polarization film 4, and an upper polarization film 5.

The liquid crystal member 2 is disposed between the graphene backlight module 1 and the upper substrate 3. The upper substrate 3 is made of an air-tight and water-tight material such as PET, glass, etc.

The lower polarization film 4 is disposed between a light emission side of the graphene backlight module 1 and the liquid crystal member 2. The upper polarization film 5 is disposed on a side of the upper substrate 3 away from the liquid crystal member 2. In other words, the upper polarization film 5 is disposed on a top side of the upper substrate 3.

Preferably, the LCD device 100 further includes a number of partition columns 6 sandwiched between the lower polarization film 4 and the upper substrate 3 and separating the liquid crystal member 2 into a number of regions. Each region corresponds to a graphene light generation block 41 in the graphene backlight module 1. From another perspective, the partition columns 6 are positioned to the non-lighting side of the graphene backlight module 1 and aligned with the first black matrix 90.

Preferably, the LCD device 100 further includes a second black matrix 7 disposed between the partition columns 6 and the upper substrate 3. In other words, the second black matrix 7 is positioned to the non-lighting side of the graphene backlight module 1 so as to prevent the leakage and mixing of the red, green, and blue lights from the graphene light generation blocks 41, thereby enhancing the purity of the lights.

The advantages of the present disclosure are as follows. Graphene is used to make the gates, sources, drains, and the light generation layer of the backlight module and the LCD device. The graphene backlight module therefore functions both as a lighting unit and a driving unit to the liquid crystal, thereby simplifying the LCD device's structure and manufacturing process. In addition, as there is no need for the light guide plate and optical films required by conventional backlight modules, the thinning of the LCD device is achievable. Furthermore, as the graphene backlight module has small light emission angles, color shift of the LCD device is reduced and color richness is enhanced. Finally, as the graphene backlight module produces light having small full width at half maximum (FWHM), the LCD device's color saturation and color richness are both enhanced.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the clams of the present disclosure.

What is claimed is:

1. A graphene backlight module, comprising a lower substrate, a plurality of graphene sources, a plurality of graphene drains, a graphene light generation layer, a first insulating protection layer, a plurality of graphene gates, a second insulating protection layer, a metallic reflection layer, and a first black matrix, wherein
the graphene sources and drains are disposed alternately at intervals on the lower substrate;
the graphene light generation layer is disposed on the lower substrate, the graphene sources and drains, where the graphene light generation layer comprises a plurality of graphene light generation blocks disposed at intervals, and each graphene light generation block covers a pair of graphene source and drain;

the first insulating protection layer covers the lower substrate and the graphene light generation layer;

the graphene gates are disposed at intervals on the first insulating protection layer, each corresponding to a graphene light generation block;

the second insulating protection layer covers the graphene gates and the first insulating protection layer;

the metallic reflection layer is disposed along a side of the lower substrate away from the graphene light generation layer; and the first black matrix is disposed on the second insulating protection layer and among the graphene light generation blocks.

2. The graphene backlight module as claimed in claim 1, wherein the graphene gates are made of a graphene oxide; the graphene sources and drains are made of a reduced graphene oxide; and the graphene light generation layer is made of a semi-reduced graphene oxide.

3. The graphene backlight module as claimed in claim 1, wherein the lower substrate is made of Polyethylene terephthalate (PET), glass, or nickel.

4. The graphene backlight module as claimed in claim 1, wherein the graphene light generation blocks produce red light if the voltage difference between the graphene gates and sources is 3.3~10V; the graphene light generation blocks produce green light of the voltage difference between the graphene gates and sources is 20~30V; and the graphene light generation blocks produce blue light if the voltage difference between the graphene gates and sources is 40~50V.

5. A graphene backlight module, comprising a lower substrate, a plurality of graphene sources, a plurality of graphene drains, a graphene light generation layer, a first insulating protection layer, a plurality of graphene gates, and a second insulating protection layer, wherein the graphene sources and drains are disposed alternately at intervals on the lower substrate;

the graphene light generation layer is disposed on the lower substrate, the graphene sources and drains, where the graphene light generation layer comprises a plurality of graphene light generation blocks disposed at intervals, and each graphene light generation block covers a pair of graphene source and drain;

the first insulating protection layer covers the lower substrate and the graphene light generation layer;

the graphene gates are disposed at intervals on the first insulating protection layer, each corresponding to a graphene light generation block; and the second insulating protection layer covers the graphene gates and the first insulating protection layer.

6. The graphene backlight module as claimed in claim 5, further comprising a metallic reflection layer disposed along a side of the lower substrate away from the graphene light generation layer.

7. The graphene backlight module as claimed in claim 5, further comprising a first black matrix disposed on the second insulating protection layer and among the graphene light generation blocks.

8. The graphene backlight module as claimed in claim 5, wherein the graphene gates are made of a graphene oxide; the graphene sources and drains are made of a reduced graphene oxide; and the graphene light generation layer is made of a semi-reduced graphene oxide.

9. The graphene backlight module as claimed in claim 5, wherein the lower substrate is made of Polyethylene terephthalate (PET), glass, or nickel.

10. The graphene backlight module as claimed in claim 5, wherein the graphene light generation blocks produce red light if the voltage difference between the graphene gates and sources is 3.3~10V; the graphene light generation blocks produce green light of the voltage difference between the graphene gates and sources is 20~30V; and the graphene light generation blocks produce blue light if the voltage difference between the graphene gates and sources is 40~50V.

11. The graphene backlight module as claimed in claim 10, wherein the graphene light generation blocks comprise graphene light generation blocks producing red light, graphene light generation blocks producing green light, and graphene light generation blocks producing blue light, disposed alternately at intervals.

12. A liquid crystal display device comprising a graphene backlight module, q liquid crystal member, an upper substrate, a lower polarization film, and an upper polarization film, wherein the liquid crystal member is disposed between the graphene backlight module and the upper substrate;

the lower polarization film is disposed between a light emission side of the graphene backlight module and the liquid crystal member;

the upper polarization film is disposed on a side of the upper substrate away from the liquid crystal member;

the graphene backlight module comprises a lower substrate, a plurality of graphene sources, a plurality of graphene drains, a graphene light generation layer, a first insulating protection layer, a plurality of graphene gates, and a second insulating protection layer;

the graphene sources and drains are disposed alternately at intervals on the lower substrate;

the graphene light generation layer is disposed on the lower substrate, the graphene sources and drains, where the graphene light generation layer comprises a plurality of graphene light generation blocks disposed at intervals, and each graphene light generation block covers a pair of graphene source and drain;

the first insulating protection layer covers the lower substrate and the graphene light generation layer;

the graphene gates are disposed at intervals on the first insulating protection layer, each corresponding to a graphene light generation block; and the second insulating protection layer covers the graphene gates and the first insulating protection layer.

13. The liquid crystal display device as claimed in claim 12, further comprising a metallic reflection layer disposed along a side of the lower substrate away from the graphene light generation layer.

14. The liquid crystal display device as claimed in claim 12, further comprising a first black matrix disposed on the second insulating protection layer and among the graphene light generation blocks.

15. The liquid crystal display device as claimed in claim 12, wherein the graphene gates are made of a graphene oxide; the graphene sources and drains are made of a reduced graphene oxide; and the graphene light generation layer is made of a semi-reduced graphene oxide.

16. The liquid crystal display device as claimed in claim 12, wherein the lower substrate is made of Polyethylene terephthalate (PET), glass, or nickel.

17. The liquid crystal display device as claimed in claim 12, wherein the graphene light generation blocks produce red light if the voltage difference between the graphene gates and sources is 3.3~10V; the graphene light generation blocks produce green light of the voltage difference between the graphene gates and sources is 20~30V; and the graphene light generation blocks produce blue light if the voltage difference between the graphene gates and sources is 40~50V.

18. The liquid crystal display device as claimed in claim 17, wherein the graphene light generation blocks comprise graphene light generation blocks producing red light, graphene light generation blocks producing green light, and graphene light generation blocks producing blue light, disposed alternately at intervals.

19. The liquid crystal display device as claimed in claim 12, further comprising a plurality of partition columns sandwiched between the lower polarization film and the upper substrate and separating the liquid crystal member into a plurality of regions, wherein each region corresponds to a graphene light generation block in the graphene backlight module.

20. The liquid crystal display device as claimed in claim 19, further comprising a second black matrix disposed between the partition columns and the upper substrate.

\* \* \* \* \*